United States Patent
Mckay et al.

(10) Patent No.: US 10,833,680 B2
(45) Date of Patent: *Nov. 10, 2020

(54) TUNABLE MICROWAVE RESONATOR FOR QUBIT CIRCUITS

(71) Applicant: International Business Machines Corporation, Armonk, NY (US)

(72) Inventors: David C. Mckay, Ossining, NY (US); Jay M. Gambetta, Yorktown Heights, NY (US); Jerry M. Chow, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/570,702

(22) Filed: Sep. 13, 2019

(65) Prior Publication Data
US 2020/0162078 A1    May 21, 2020

Related U.S. Application Data

(63) Continuation of application No. 16/197,654, filed on Nov. 21, 2018, now Pat. No. 10,491,221.

(51) Int. Cl.
*H03K 19/195* (2006.01)
*H03H 11/04* (2006.01)
*G06N 10/00* (2019.01)

(52) U.S. Cl.
CPC ......... *H03K 19/195* (2013.01); *G06N 10/00* (2019.01); *H03H 11/04* (2013.01)

(58) Field of Classification Search
CPC ....... H03K 19/195; G06N 10/00; H03H 11/04

USPC .......................................................... 326/4
See application file for complete search history.

(56) References Cited

U.S. PATENT DOCUMENTS

| | | | | |
|---|---|---|---|---|
| 5,963,351 | A * | 10/1999 | Kaplounenko | H03L 7/24 329/346 |
| 7,613,765 | B1 * | 11/2009 | Hilton | G06N 10/00 708/801 |
| 8,022,722 | B1 * | 9/2011 | Pesetski | G06N 10/00 326/7 |

(Continued)

FOREIGN PATENT DOCUMENTS

WO    2017115160 A1    7/2017

OTHER PUBLICATIONS

List of all IBM related dockets. Appendix P, 2019.

(Continued)

*Primary Examiner* — Don P Le
(74) *Attorney, Agent, or Firm* — Garg Law Firm, PLLC; Rakesh Garg; Keivan Razavi

(57) ABSTRACT

In an embodiment, a quantum circuit (circuit) includes a first qubit and a second qubit. In an embodiment, a quantum circuit includes a tunable microwave resonator, wherein a first applied magnetic flux is configured to tune the microwave resonator to a first frequency, the first frequency configured to activate an interaction between the first qubit and the second qubit, and wherein a second applied magnetic flux is configured to tune the microwave resonator to a second frequency, the second frequency configured to minimize an interaction between the first qubit and the second qubit.

19 Claims, 6 Drawing Sheets

(56) References Cited

U.S. PATENT DOCUMENTS

| | | | | |
|---|---|---|---|---|
| 8,111,083 B1* | 2/2012 | Pesetski | ............... | B82Y 10/00 |
| | | | | 326/3 |
| 10,056,908 B2* | 8/2018 | Rigetti | ............... | G06N 10/00 |
| 2004/0077503 A1* | 4/2004 | Blais | ............... | B82Y 10/00 |
| | | | | 505/190 |
| 2004/0156407 A1* | 8/2004 | Beausoleil | ............ | G06N 10/00 |
| | | | | 372/43.01 |
| 2005/0001209 A1* | 1/2005 | Hilton | ............... | B82Y 10/00 |
| | | | | 257/20 |
| 2016/0267032 A1* | 9/2016 | Rigetti | ............... | G06F 13/36 |
| 2017/0093381 A1* | 3/2017 | Abdo | ............... | H01L 39/025 |
| 2019/0044668 A1* | 2/2019 | Elsherbini | ............ | G06N 10/00 |

OTHER PUBLICATIONS

Kandala et al., "Hardware-efficient variational quantum eigensolver for small molecules and quantum magnets", Oct. 16, 2017.
Reagor et al., "Demonstration of universal parametric entangling gates on a multi-qubit lattice", Science Advances, vol. 4, No. 2, Feb. 2, 2018.
International Searching Authority, PCT/EP2019/080572, dated Feb. 13, 2020.

\* cited by examiner

TUNABLE MICROWAVE RESONATOR FOR QUBIT CIRCUITS

TECHNICAL FIELD

The present invention relates generally to a device, a fabrication method, and fabrication system for adjusting the resonance frequencies in quantum processors. More particularly, the present invention relates to a device, method, and system for a tunable microwave resonator for quantum circuits.

BACKGROUND

Hereinafter, a "Q" prefix in a word or phrase is indicative of a reference of that word or phrase in a quantum computing context unless expressly distinguished where used.

Quantum mechanics is a branch of physics that describes how the physical world works at the most fundamental level. According to quantum mechanics, objects can behave in ways that are counterintuitive, such as being in more than one state at the same time (superposition) and being entangled with other objects. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (Q-processor) uses the unintuitive nature of entangled qubit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines Corporation in the United States and in other countries.)

A superconducting qubit includes a Josephson junction. A Josephson junction is formed by separating two superconducting metal layers by a thin insulating material. When the metal in the superconducting layers is caused to become superconducting—e.g. by reducing the temperature of the metal to a specified cryogenic temperature—pairs of electrons can tunnel from one superconducting layer through the insulating layer to the other superconducting layer. The equations describing this process are identical to that of a non-dissipative nonlinear inductor. In a qubit, the Josephson junction is electrically coupled in parallel with one or more capacitive devices forming a nonlinear microwave oscillator. The oscillator has a resonance/transition frequency determined by the value of the Josephson junction inductance and the parallel capacitance. Any reference to the term "qubit" is a reference to a superconducting qubit oscillator circuitry that employs a Josephson junction unless expressly distinguished where used.

The information processed by qubits is carried or transmitted in the form of microwave signals/photons in the range of microwave frequencies. The microwave frequency of a qubit output is determined by the resonance frequency of the qubit. The microwave signals are captured, processed, and analyzed to decipher the quantum information encoded therein. A readout circuit is a circuit coupled with the qubit to capture, read, and measure the quantum state of the qubit. An output of the readout circuit is information usable by a Q-processor to perform computations.

A superconducting qubit has two quantum states—$|0\rangle$ and $|1\rangle$. These two states may be two energy states of atoms, for example, the ground ($|0\rangle$) and first excited state ($|1\rangle$) of a superconducting artificial atom (superconducting qubit). Other examples include spin-up and spin-down of the nuclear or electronic spins, two positions of a crystalline defect, and two states of a quantum dot. Since the system is of a quantum nature, any combination of the two states is allowed and valid.

For quantum computing using qubits to be reliable, quantum circuits, e.g., the qubits themselves, the readout circuitry associated with the qubits, and other parts of the quantum processor, must not alter the energy states of the qubit, such as by injecting or dissipating energy, in any significant manner or influence the relative phase between the $|0\rangle$ and $|1\rangle$ states of the qubit. This operational constraint on any circuit that operates with quantum information necessitates special considerations in fabricating semiconductor and superconducting structures that are used in such circuits.

The illustrative embodiments recognize that a qubit's resonance frequency is inherently fixed at the time the qubit is fabricated, i.e., when the Josephson Junction and the capacitive element of the qubit-oscillator are fabricated on a Q-processor chip. The illustrative embodiments further recognize that in the simplest implementation of a quantum processor (Q-processor), at least two qubits are needed to implement a quantum logic gate (Q-gate). Therefore, a Q-processor chip is typically fabricated to have at least 2, but often 8, 16, hundreds, thousands, or more qubits on a single Q-processor chip. The illustrative embodiments recognize that a fixed-frequency microwave resonator (bus) connects neighboring qubits such that the appropriate microwave signals can be passed between qubits to activate a Q-gate.

Some qubits are fixed-frequency qubits, i.e., their resonance frequencies are not changeable. Other qubits are frequency-tunable qubits. A Q-processor can employ fixed-frequency qubits, frequency-tunable qubits, or a combination thereof.

The illustrative embodiments recognize that when the resonance frequencies of two neighboring coupled qubits on a chip are the same or within a threshold band of frequencies or their higher transition frequencies are on resonance or close to resonance, then negative effects can happen such as, crosstalk, quantum decoherence, energy decay, creation of mixed states, unintended information transfer, quantum state leakage and so on. Having such qubits can also negatively affect the performance or utility of certain quantum gates such as cross-resonance gates which have stringent requirements on the spectrum of resonance frequencies of qubits upon which the gate is operating on. Therefore, the illustrative embodiments recognize that one challenge in quantum processors that are based on coupled fixed-frequency qubits is frequency crowding or frequency collision between adjacent qubits, in particular, when cross-resonance gates are used.

It is important to note that while the proposed tuning technique is motivated by the need to solve frequency collisions of coupled qubits on the same chip which are acted on with cross-resonance gates, the proposed tuning technique is general, and can be applied to other kinds of quantum devices on chip which require gates based on microwave-driven qubits.

The illustrative embodiments recognize that a fixed-frequency qubit (hereinafter compactly referred to as a "fixed qubit") is designed to be fixed in frequency to be immune to flux noise. The illustrative embodiments recognize that one challenge in quantum processors that are based on fixed-frequency qubits is low on/off ratios between when microwave signals turn on an interaction (on interaction strength) and the interactions between neighboring qubits when these signals are disabled (off interaction strength). The illustrative embodiments further recognize that one challenge in quantum processors that are based on fixed-frequency qubits is enabling a gate of interest without producing unwanted interactions at other gates.

SUMMARY

The illustrative embodiments provide an electronic decoupling device, and a method and system of fabrication therefor. A device of an embodiment includes a first qubit and a second qubit. In an embodiment, the device includes a tunable microwave resonator, wherein a first applied magnetic flux is configured to tune the microwave resonator to a first frequency, the first frequency configured to activate an interaction between the first qubit and the second qubit, and wherein a second applied magnetic flux is configured to tune the microwave resonator to a second frequency, the second frequency configured to minimize an interaction between the first qubit and the second qubit.

In an embodiment, the tunable microwave resonator includes an inductor element, a capacitor element, and a superconducting quantum interference device (SQUID) loop. In an embodiment, the tunable microwave resonator further includes a first Josephson junction and a second Josephson junction. In an embodiment, the SQUID is an asymmetric SQUID.

In an embodiment, the first frequency is in a range of about 1-2 GHz of a resonance frequency of the first qubit, inclusive of both ends of the range. In an embodiment, the device includes a third qubit. In an embodiment, the device includes a second tunable microwave resonator, wherein a third applied magnetic flux is configured to tune the second tunable microwave resonator to a third frequency, the third frequency configured to activate an interaction between the second qubit and the third qubit, and wherein a fourth applied magnetic flux is configured to tune the second tunable microwave resonator to a fourth frequency, the fourth frequency configured to minimize an interaction between the second qubit and the third qubit.

In an embodiment, the second tunable microwave resonator is configured to be tuned to the fourth resonance frequency while the first tunable microwave resonator is tuned to the first frequency. In an embodiment, the tunable microwave resonator is configured to be tuned to the second resonance frequency while the second tunable microwave resonator is tuned to the third resonance frequency.

In an embodiment, the first frequency and the second frequency differ by between about 3-10 GHz. In an embodiment, the first qubit and the second qubit are fixed-frequency qubits. In an embodiment, the interaction is a cross-resonance gate. In an embodiment, an applied magnetic flux of about 0.5 magnetic flux quanta is configured to tune the microwave resonator to the first frequency. In an embodiment, an applied magnetic flux of about zero is configured to tune the microwave resonator to the second frequency.

In an embodiment, a method includes configuring a first qubit, the first qubit including a first resonance frequency. In an embodiment, a method includes configuring a second qubit, the second qubit including a second resonance frequency. In an embodiment, a method includes configuring a tunable microwave resonator, wherein a first applied magnetic flux is configured to tune the microwave resonator to a first frequency, the first frequency configured to activate an interaction between the first qubit and the second qubit, and wherein a second applied magnetic flux is configured to tune the microwave resonator to a second frequency, the second frequency configured to minimize an interaction between the first qubit and the second qubit.

In an embodiment, the first frequency is in a range of about 1-2 GHz of a resonance frequency of the first qubit, inclusive of both ends of the range. In an embodiment, a method includes configuring a third qubit, the third qubit including a third resonance frequency.

In an embodiment, a method includes configuring a second tunable microwave resonator, wherein a third applied magnetic flux is configured to tune the second tunable microwave resonator to a third frequency, the third frequency configured to activate an interaction between the second qubit and the third qubit, and wherein a fourth applied magnetic flux is configured to tune the second tunable microwave resonator to a fourth frequency, the fourth frequency configured to minimize an interaction between the second qubit and the third qubit.

In an embodiment, the tunable microwave resonator is configured to be tuned to the second resonance frequency while the second tunable microwave resonator is tuned to the third resonance frequency. In an embodiment, the second tunable microwave resonator is configured to be tuned to the fourth resonance frequency while the first tunable microwave resonator is tuned to the first frequency.

An embodiment includes a fabrication method for fabricating the tunable microwave resonator device.

An embodiment includes a fabrication system for fabricating the tunable microwave resonator device.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
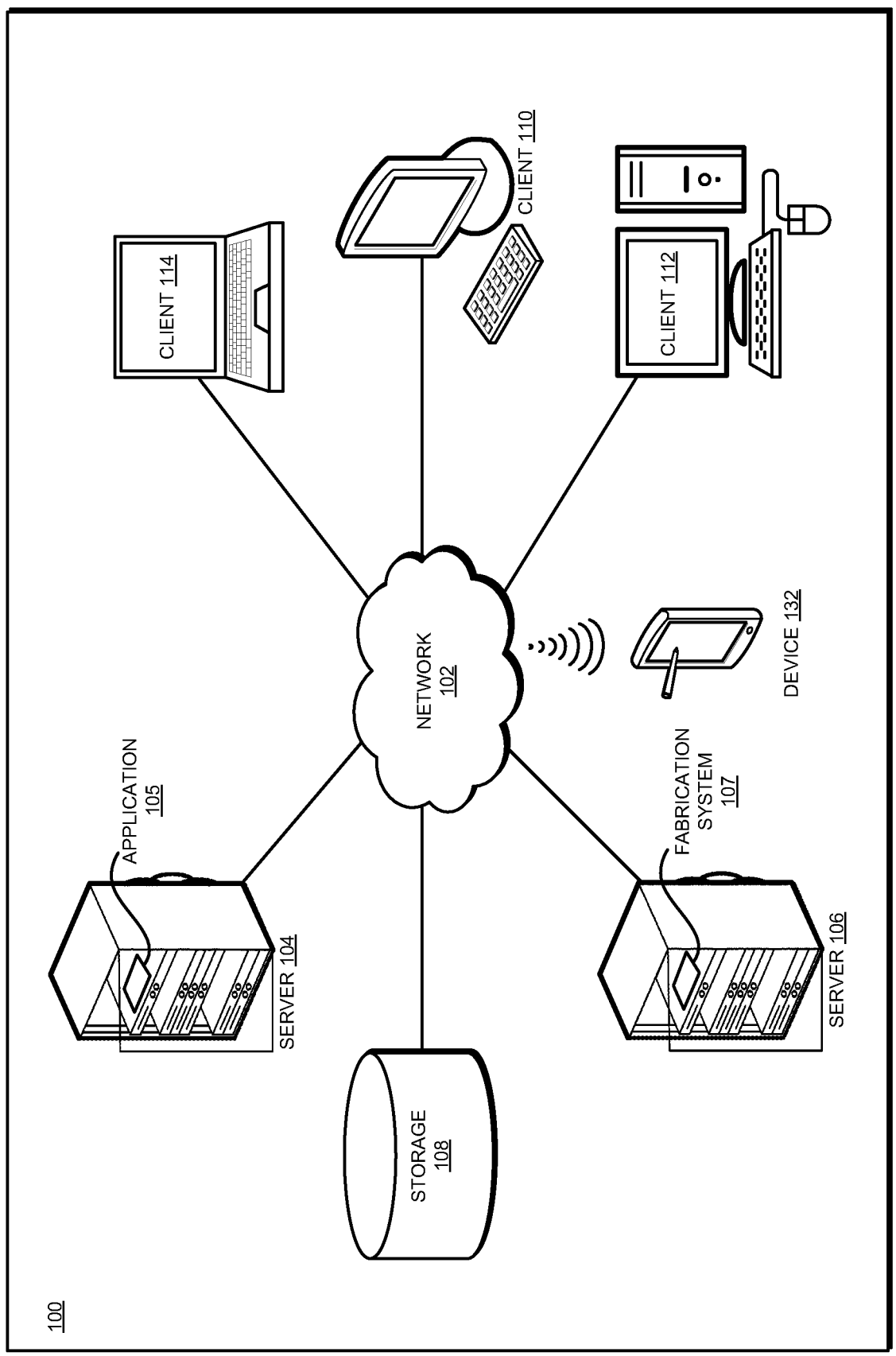
FIG. 1 depicts a block diagram of a network of data processing systems in which illustrative embodiments may be implemented.

The illustrative embodiments used to describe the invention generally address and solve the above-described needs for tuning microwave resonators for qubit circuits. The illustrative embodiments provide tunable microwave resonators for qubit circuits, which address the above-described need or problem.

An operation described herein as occurring with respect to a frequency of frequencies should be interpreted as occurring with respect to a signal of that frequency or frequencies. All references to a "signal" are references to a microwave signal unless expressly distinguished where used.

An embodiment provides a configuration of a tunable microwave resonator whereby the resonator can be tuned to a frequency (F1) to activate an interaction between qubits and a second frequency (F2) to minimize an interaction between qubits. Another embodiment provides a fabrication method for the tunable microwave resonator, such that the method can be implemented as a software application. The application implementing a fabrication method embodiment can be configured to operate in conjunction with an existing semiconductor fabrication system—such as a lithography system, or a circuit assembly system.

For the clarity of the description, and without implying any limitation thereto, the illustrative embodiments are described using some example configurations. From this disclosure, those of ordinary skill in the art will be able to conceive many alterations, adaptations, and modifications of a described configuration for achieving a described purpose, and the same are contemplated within the scope of the illustrative embodiments.

Furthermore, simplified diagrams of the example resistors, inductors, capacitors, and other circuit components are used in the figures and the illustrative embodiments. In an actual fabrication or circuit, additional structures or component that are not shown or described herein, or structures or components different from those shown but for a similar function as described herein may be present without departing the scope of the illustrative embodiments.

Furthermore, the illustrative embodiments are described with respect to specific actual or hypothetical components only as examples. The steps described by the various illustrative embodiments can be adapted for fabricating a circuit using a variety of components that can be purposed or repurposed to provide a described function within a quantum device, and such adaptations are contemplated within the scope of the illustrative embodiments.

The illustrative embodiments are described with respect to certain types of materials, electrical properties, steps, numerosity, frequencies, circuits, components, and applications only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

With reference to the figures and in particular with reference to FIG. 1, this figure is an example diagram of a data processing environment in which illustrative embodiments may be implemented. FIG. 1 is only an example and is not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Device 132 is an example of a mobile computing device. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is any suitable system for fabricating a quantum device. Application 105 provides instructions to system 107 for fabrication of quantum devices in a manner described herein.

Figure 2:
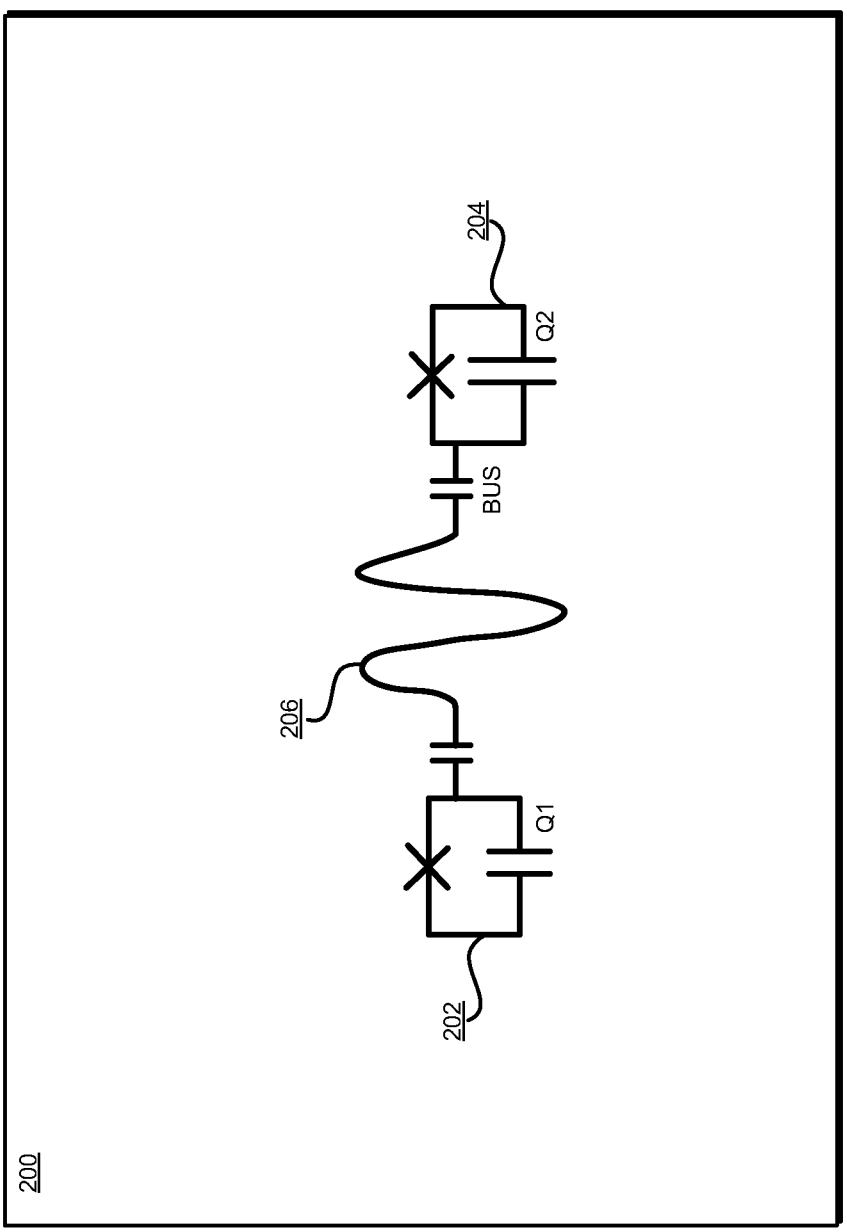
FIG. 2 depicts a block diagram of an example circuit implementing a presently available fixed-frequency microwave resonator in accordance with an illustrative embodiment.

With reference to FIG. 2, this figure depicts a block diagram of an example circuit implementing a presently available fixed-frequency microwave resonator in accordance with an illustrative embodiment. Circuit 200 comprises a set of qubits 202, 204. Microwave resonator 206 couples qubit 202 to qubit 204. For example, the resonance frequency of microwave resonator 206 is such that it is within a threshold frequency for strong coupling of qubits 202, 204. For example, the threshold frequency range can be a range within 1-2 GHz of the resonance frequency for the qubits. Microwave resonator 206 enables a q-gate between qubit 202 and 204. For example, microwave resonator 206 can allow a microwave signal at the frequency of qubit 204 applied to qubit 202 to drive qubit 204 dependent on the state of qubit 202 (this is the cross-resonance gate between the qubits 202, 204). Fixed-frequency microwave resonator 206 produces an always on interaction between qubits 202, 204. The always on interaction produces an energy shift in the qubits 202, 204 that depends on the state of qubits 202, 204. The magnitude of the energy shift depends upon the difference between the resonance frequency of the microwave resonator 206 and the fixed frequency of the qubits 202, 204. For example, the magnitude of the energy shift is approximately proportional to the inverse square of the frequency difference.

Figure 3:
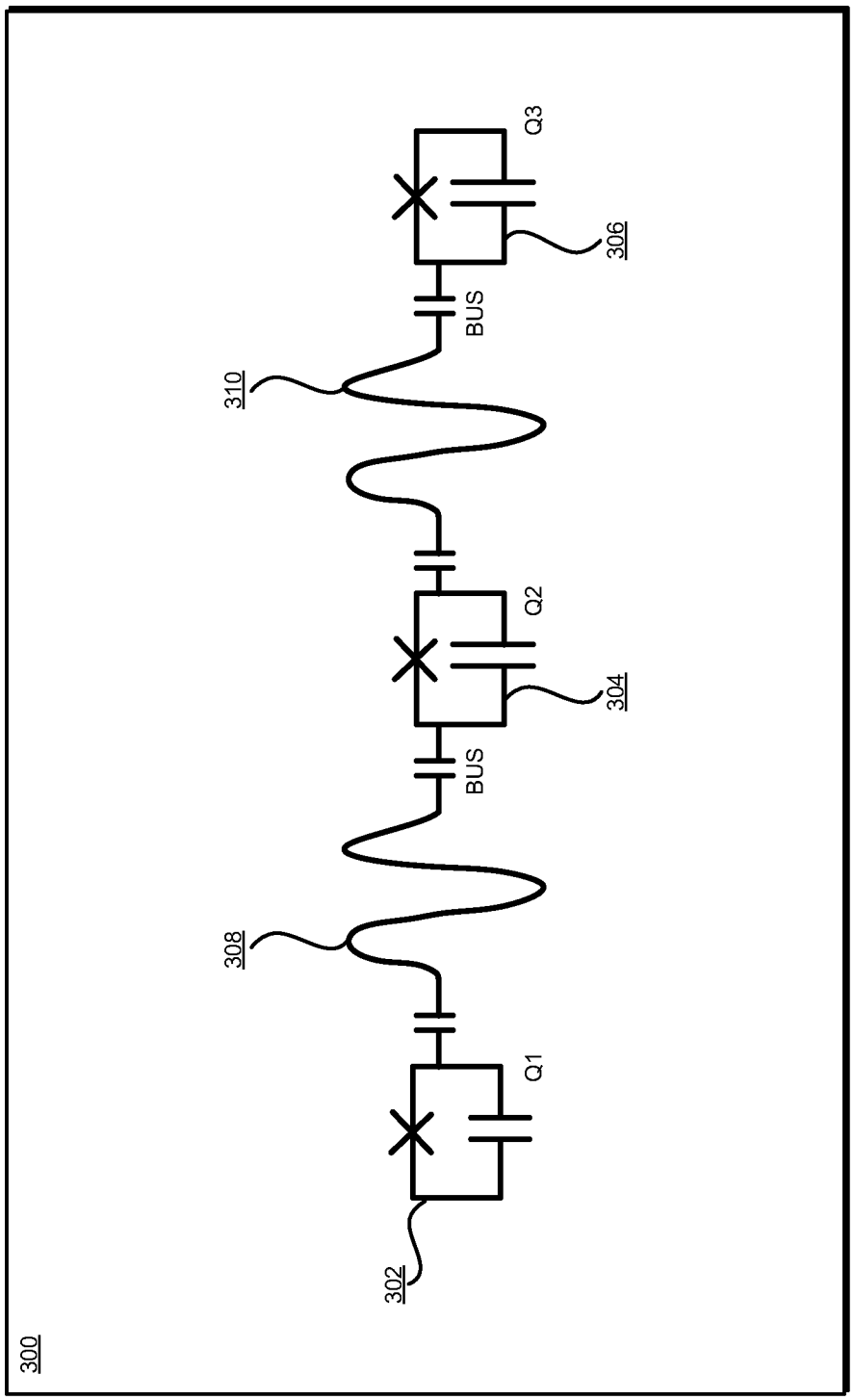
FIG. 3 depicts a block diagram of an example circuit implementing presently available fixed-frequency microwave resonators in accordance with an illustrative embodiment.

With reference to FIG. 3, this figure depicts a block diagram of an example circuit implementing presently available fixed-frequency microwave resonators in accordance with an illustrative embodiment. Circuit 300 comprises a set of one or more fixed-frequency qubits 302, 304, . . . 306. Fixed frequency microwave resonator 308 couples qubit 302 to qubit 304. Fixed frequency microwave resonator 310 couples qubit 304 to qubit 306.

Microwave resonator 308 is configured to operate with qubit 302 and qubit 304. Microwave resonator 308 enables a q-gate between qubit 302 and qubit 304. For example, microwave resonator 308 can enable a cross-resonance gate between the qubits 302, 304.

Microwave resonator 310 is configured to operate with qubit 304 and qubit 306. Microwave resonator 310 enables a q-gate between qubit 304 and qubit 306. For example, microwave resonator 310 can enable a cross-resonance gate between the qubits 304, 306.

Microwave resonator 308 can negatively affect the performance of a cross-resonance gate between the qubits 304, 306. Likewise, microwave resonator 310 can negatively affect the performance of a cross-resonance gate between the qubits 302, 304. For example, microwave resonator 308 can produce an unintended always on interaction between qubits 304, 306. The unwanted always on interaction between qubits 304, 306 is stronger when the frequency difference between qubits 304, 306 and the resonator 308 is small. Likewise, microwave resonator 310 can produce an unintended always on interaction between qubits 302, 304.

Figure 4:
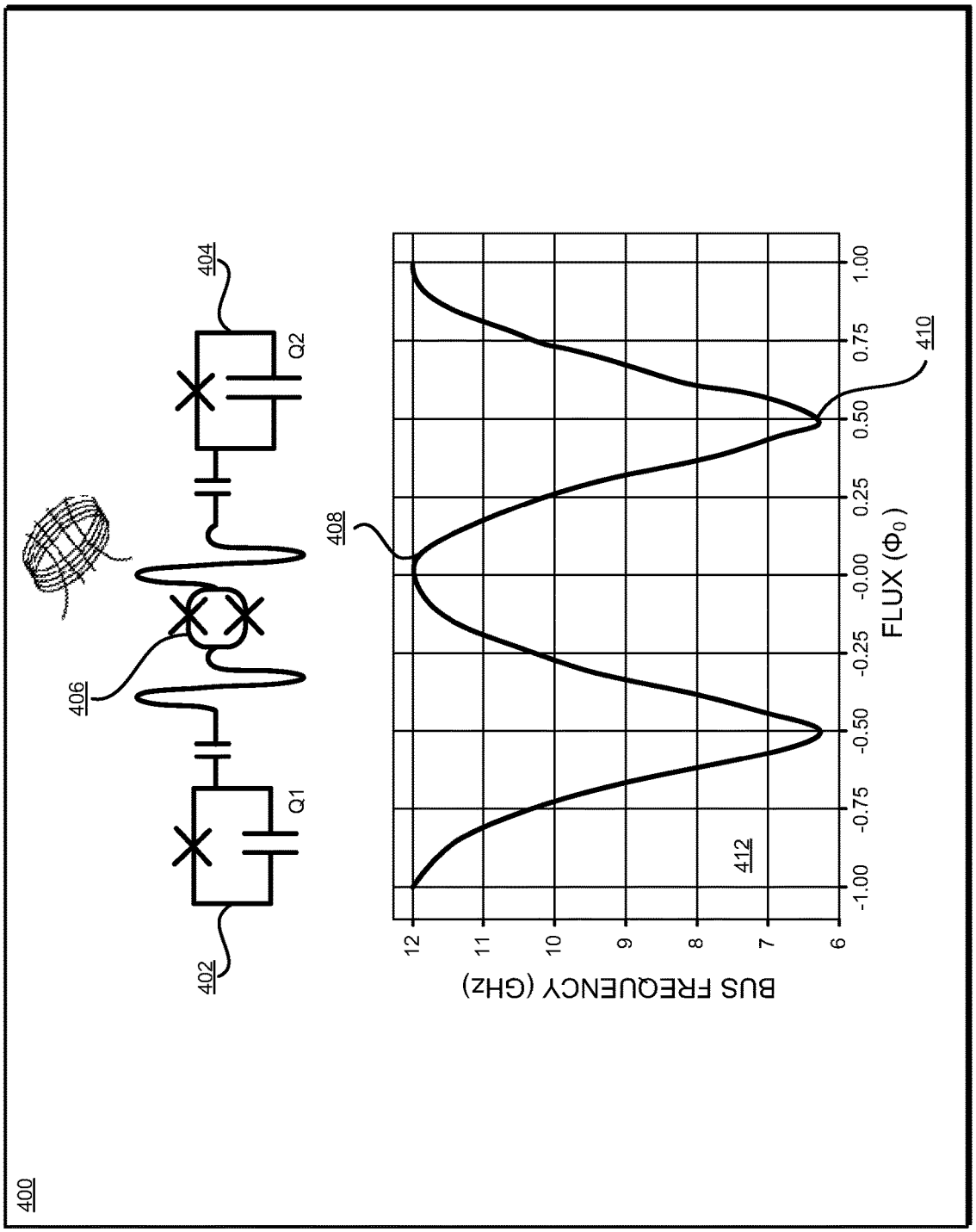
FIG. 4 depicts a block diagram of an example circuit implementing a tunable microwave resonator in accordance with an illustrative embodiment.

With reference to FIG. 4, this figure depicts a block diagram of an example circuit implementing a tunable microwave resonator in accordance with an illustrative embodiment. Circuit 400 comprises a set of qubits 402, 404. Microwave resonator 406 variably couples qubit 402 to qubit 404. For example, a first applied magnetic flux can tune microwave resonator 406 to a first frequency to activate an interaction between qubit 402 and qubit 404. As another example, a second applied magnetic flux can tune microwave resonator 406 to a second frequency to minimize an interaction between qubit 402 and qubit 404. Microwave resonator 406 couples qubit 402 and 404 thus allowing a q-gate. For example, microwave resonator 406 can allow a cross-resonance gate between the qubits 402, 404.

Microwave resonator 406 is configured to operate with qubit 402 and qubit 404. Microwave resonator 406 acts as a flux tunable microwave resonator. In an embodiment, microwave resonator 406 includes an inductor element, a capacitor element, and a superconducting quantum interference device (SQUID) loop that adds a tunable inductance. For example, the SQUID can include a pair of Josephson junctions. In an embodiment, the SQUID is an asymmetric SQUID. For example, a first Josephson junction can have a greater inductance than a second Josephson junction. As another example, a first Josephson junction can have a greater normal resistance than a second Josephson junction.

In an embodiment, microwave resonator 406 minimizes an unintended interaction between qubit 402 and qubit 404. In an embodiment, microwave resonator 406 is tuned to a microwave resonance frequency to decouple qubit 402 and qubit 404. For example, microwave resonator 406 can be tuned to a microwave resonance frequency at least a threshold frequency distance from the resonance frequency of qubit 402 and qubit 404. In an embodiment, a threshold frequency distance is at least 5 GHz from the resonance frequency.

In an embodiment, an applied magnetic flux is configured to change the microwave resonance frequency of microwave resonator 406 to minimize an unintended interaction between qubit 402 and qubit 404. For example, a magnetic flux can be applied to the asymmetric SQUID to tune microwave resonator 406 to tune the microwave resonance frequency at least a threshold frequency distance from the resonance frequency of qubit 402 and qubit 404. For example, a first applied magnetic flux can tune microwave resonator 406 to a first frequency to activate an interaction between qubit 402 and qubit 404. As another example, a second applied magnetic flux can tune microwave resonator 406 to a second frequency to minimize an interaction between qubit 402 and qubit 404. For example, a magnetic flux can be applied to asymmetric squid to tune microwave resonator 406 to a microwave frequency within a threshold range of the resonance frequency.

In an embodiment, the applied magnetic flux to shift the microwave resonance frequency to perform an interaction is greater than the applied magnetic flux to shift the microwave resonance frequency to minimize an interaction. In another example embodiment, the applied magnetic flux to shift the microwave resonance frequency to minimize an interaction is greater than the applied magnetic flux to perform an interaction. In another example embodiment, the magnitude of the applied magnetic flux to shift the microwave resonance frequency to perform an interaction is about 0.5 magnetic flux quanta. In another example embodiment, the magnitude of the applied magnetic flux to shift the microwave resonance frequency to minimize an interaction is about 0 magnetic flux quanta.

Graph 412 depicts the tuning characteristics of microwave resonator 406. As can be seen in graph 412, an applied magnetic flux shifts the resonance frequency of the microwave resonator 406. At point 408 in graph 412, with no magnetic flux applied, the microwave resonator 406 has a resonance frequency of about 12 GHz, outside the range of frequencies, about 1-8 GHz, at which qubits operate. In an embodiment, point 408 corresponds to a point with zero flux-tuning sensitivity, i.e., the slope of frequency versus flux is zero. At point 410 in graph 412, with an applied magnetic flux of 0.5 magnetic flux quantum, the microwave resonator frequency is about 6 GHz, within the range of frequencies at which qubits operate. As can be seen in graph 412, microwave resonator 406 can be tuned to two frequencies with a frequency distance between the two frequencies of about 6 GHz. In an embodiment, point 410 corresponds to a point with zero flux-tuning sensitivity, i.e., the slope of frequency versus flux is zero.

Figure 5:
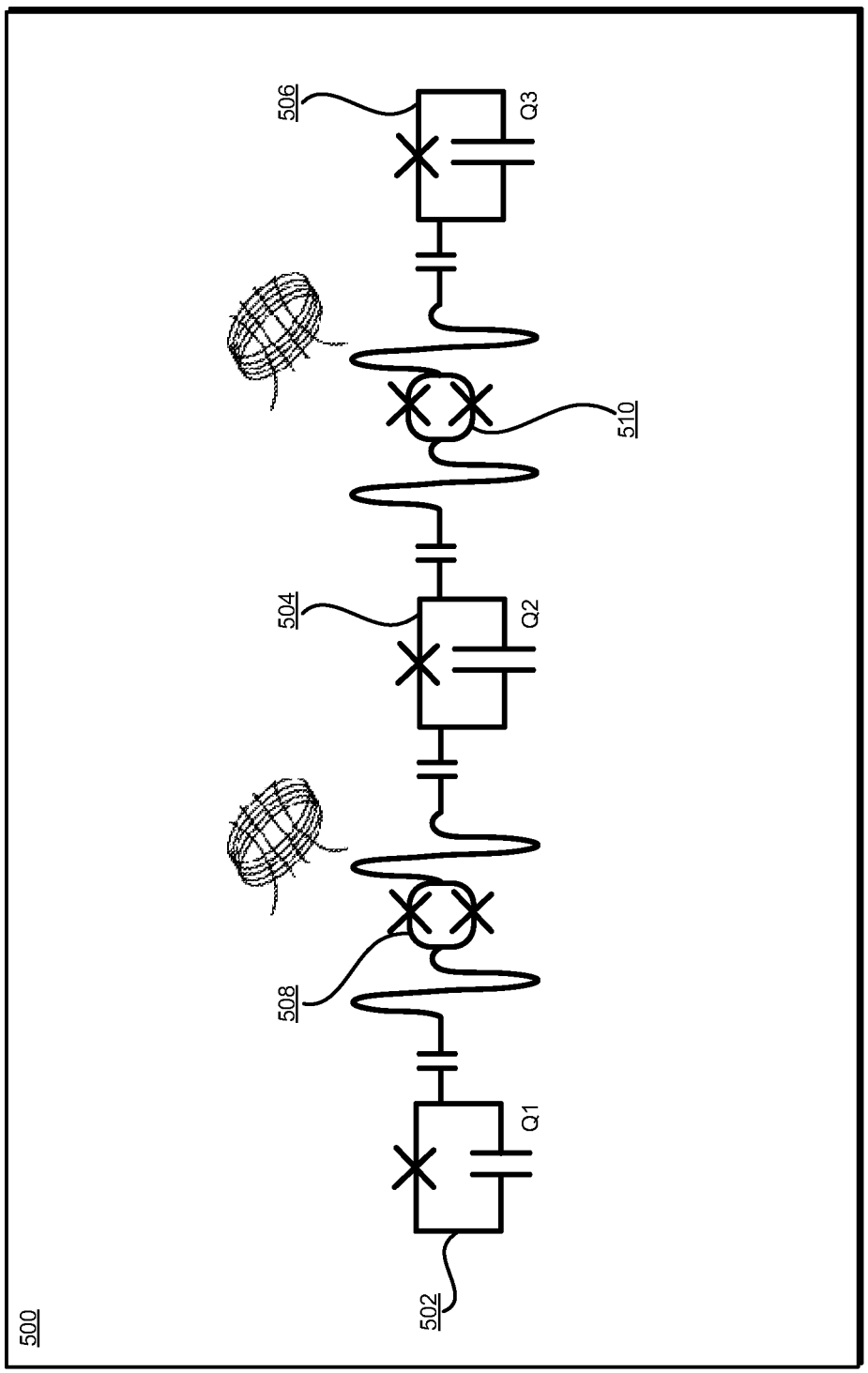
FIG. 5 depicts a block diagram of an example circuit implementing a tunable microwave resonator in accordance with an illustrative embodiment.

With reference to FIG. 5, this figure depicts a block diagram of an example circuit implementing a tunable microwave resonator in accordance with an illustrative embodiment. Circuit 500 comprises a set of one or more fixed-frequency qubits 502, 504, . . . 506. Microwave resonator 508 variably couples qubit 502 to qubit 504. Microwave resonator 510 variably couples qubit 504 to qubit 506.

One embodiment configures a tunable microwave resonator with some but not all pairs of qubits. Another embodiment configures a tunable microwave resonator with each pair of qubits, as shown in FIG. 5. For example, tunable microwave resonator 508 is configured to operate with qubit 502 and qubit 504. Microwave resonator 508 enables a q-gate between qubit 502 and qubit 504. Microwave resonator 508 is configured to be tuned to the first frequency to perform an interaction between qubits 502, 504. For example, microwave resonator 508 can be configured to be tuned to a first frequency within a threshold frequency range from the resonance frequency of qubit 502 and qubit 504. For example, the threshold frequency range can be a range within 1-2 GHz of the qubit resonance frequency.

An embodiment configures microwave resonator 508 to be tuned to a second frequency to minimize an interaction between qubit 502 and qubit 504. For example, an embodiment can configure microwave resonator 508 to be tuned to a second frequency a threshold frequency distance from the resonance frequency. For example, the threshold frequency distance can be at least 5 GHz from the resonance frequency. In an embodiment, microwave resonator 508 can be tuned to a second resonance frequency while the microwave resonator 510 can be tuned to a third resonance frequency to perform an interaction between qubit 504 and qubit 506. In an embodiment, the second resonance frequency of microwave resonator 510 differs from the first resonance frequency of microwave resonator 508 by about 5 GHz.

An embodiment configures microwave resonator 510 to enable interactions between qubit 504 and qubit 506 at a third resonance frequency. Microwave resonator 510 activates a q-gate between qubit 504 and qubit 506. For example, microwave resonator 510 can enable a cross-resonance gate between the qubits 504, 506 at a resonance frequency. An embodiment configures microwave resonator 510 to minimize an interaction between qubit 504 and qubit 506 at a fourth resonance frequency. For example, microwave resonator 510 can minimize an always on interaction between qubit 504 and qubit 506. In an embodiment, microwave resonator 510 can be tuned to a fourth resonance frequency a threshold frequency distance away from the resonance frequency of qubit 504 and qubit 506. For example, the threshold frequency distance can be at least 5 GHz from the resonance frequency. In an embodiment, microwave resonator 510 can be tuned to the fourth frequency while the microwave resonator 508 is tuned to the first frequency to perform an interaction between qubit 502 and qubit 504. In an embodiment, the fourth resonance frequency of the microwave resonator 510 differs from the first resonance frequency of the microwave resonator 508 by about 5 GHz.

The configuration 500 of FIG. 5 is not intended to be limiting. From this disclosure, those of ordinary skill in the art will be able to conceive many other implementations for a depicted configuration, e.g., using additional or different elements to achieve a similar function of the configuration shown here, and such implementations are contemplated within the scope of the illustrative embodiments. An embodiment configures a plurality of qubits arranged in an array on a q-processor. In an embodiment, each qubit is variably coupled to at least one neighboring qubit in the array by a tunable microwave resonator.

Figure 6:
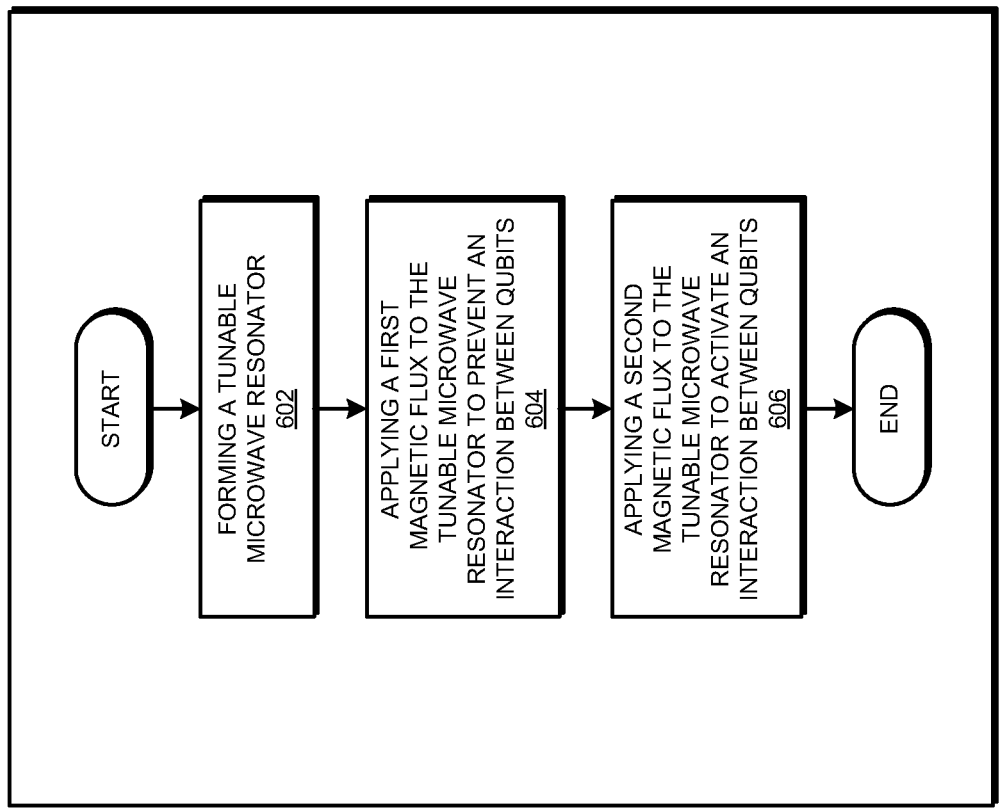
FIG. 6 depicts a flowchart of an example process of fabricating and operating a device for tuning a microwave resonator for a quantum circuit in accordance with an illustrative embodiment.

With reference to FIG. 6, this figure depicts a flowchart of an example process of fabricating and operating a device for tuning a microwave resonator for a quantum circuit in accordance with an illustrative embodiment. Process 600 can be implemented in a fabrication system, e.g., in a software application that operates the fabrication system, to cause the described operations.

The embodiment forms a tunable microwave resonator (block 602). The embodiment configures the tunable microwave resonator to be tuned to a first frequency and a second resonance frequency (block 604). In an embodiment, the first frequency value is set so as to perform an interaction between a plurality of qubits. In an embodiment, the second resonance frequency is set to minimize an interaction between a plurality of qubits. The embodiment tunes the resonator to the second frequency to minimize an interaction between a plurality of qubits (block 606). Process 600 ends thereafter.

Various embodiments of the present invention are described herein with reference to the related drawings. Alternative embodiments can be devised without departing from the scope of this invention. For example, additional qubits, additional tunable microwave resonators, and additional circuit components can be implemented in accordance with an embodiment. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A quantum circuit (circuit) comprising:
   a first qubit;
   a second qubit;
   a tunable microwave resonator; and
   an asymmetric superconducting quantum interference device (SQUID) loop, wherein a magnetic flux is applied to the SQUID loop to tune the microwave resonator to a microwave frequency within a threshold range of a resonance frequency to minimize an unintended interaction between the first qubit and the second qubit.

2. The circuit of claim 1, the tunable microwave resonator comprising:
   an inductor element;
   a capacitor element; and
   a superconducting quantum interference device (SQUID) loop.

3. The circuit of claim 2, the tunable microwave resonator further comprising:
   a first Josephson junction; and
   a second Josephson junction.

4. The circuit of claim 2, wherein the SQUID is an asymmetric SQUID.

5. The circuit of claim 1, wherein the first frequency is in a range of about 1-2 GHz of a resonance frequency of the first qubit, inclusive of both ends of the range.

6. The circuit of claim 1, further comprising:
   a third qubit; and
   a second tunable microwave resonator, wherein a third applied magnetic flux is configured to tune the second tunable microwave resonator to a third frequency, the third frequency configured to activate an interaction between the second qubit and the third qubit, and wherein a fourth applied magnetic flux is configured to tune the second tunable microwave resonator to a fourth frequency, the fourth frequency configured to minimize an interaction between the second qubit and the third qubit.

7. The circuit of claim 6, wherein the second tunable microwave resonator is configured to be tuned to the fourth resonance frequency while the first tunable microwave resonator is tuned to the first frequency.

8. The circuit of claim 6, wherein the tunable microwave resonator is configured to be tuned to the second resonance frequency while the second tunable microwave resonator is tuned to the third resonance frequency.

9. The circuit of claim 1, wherein the first frequency and the second frequency differ by between about 3-10 GHz.

10. The circuit of claim 1, wherein the first qubit and the second qubit are fixed-frequency qubits.

11. The circuit of claim 1, wherein the interaction is a cross-resonance gate.

12. The circuit of claim 1, wherein an applied magnetic flux is configured to tune the microwave resonator to the first frequency.

13. The circuit of claim 1, further comprising:
   a plurality of qubits arranged in an array, wherein each qubit of the plurality of qubits is variably coupled to at least one neighboring qubit in the array by a tunable microwave resonator.

14. A method comprising:
   configuring a first qubit, the first qubit including a first resonance frequency;
   configuring a second qubit, the second qubit including a second resonance frequency;
   configuring a tunable microwave resonator; and
   configuring an asymmetric superconducting quantum interference device (SQUID) loop, wherein a magnetic flux is applied to the SQUID loop to tune the microwave resonator to a microwave frequency within a threshold range of a resonance frequency to minimize an unintended interaction between the first qubit and the second qubit.

15. The method of claim 14, wherein the first frequency is in a range of about 1-2 GHz of a resonance frequency of the first qubit, inclusive of both ends of the range.

16. The method of claim 14, further comprising:
   configuring a third qubit, the third qubit including a third resonance frequency; and
   configuring a second tunable microwave resonator, wherein a third applied magnetic flux is configured to tune the second tunable microwave resonator to a third frequency, the third frequency configured to activate an interaction between the second qubit and the third qubit, and wherein a fourth applied magnetic flux is configured to tune the second tunable microwave resonator to a fourth frequency, the fourth frequency configured to minimize an interaction between the second qubit and the third qubit.

17. The method of claim 15, wherein the tunable microwave resonator is configured to be tuned to the second resonance frequency while the second tunable microwave resonator is tuned to the third resonance frequency.

18. The method of claim 15, further comprising:
configuring a plurality of qubits arranged in an array, wherein each qubit of the plurality of qubits is variably coupled to at least one neighboring qubit in the array by a tunable microwave resonator.

19. A circuit fabrication system performing operations comprising:
configuring a first qubit, the first qubit including a first resonance frequency;
configuring a second qubit, the second qubit including a second resonance frequency;
configuring a tunable microwave resonator; and
configuring an asymmetric superconducting quantum interference device (SQUID) loop, wherein a magnetic flux is applied to the SQUID loop to tune the microwave resonator to a microwave frequency within a threshold range of a resonance frequency to minimize an unintended interaction between the first qubit and the second qubit.

* * * * *